US012683353B2

(12) United States Patent
Murakami et al.

(10) Patent No.: US 12,683,353 B2
(45) Date of Patent: Jul. 14, 2026

(54) MANUFACTURING METHOD OF LIGHT-EMITTING DEVICE, AND LIGHT-EMITTING DEVICE

(71) Applicant: NICHIA CORPORATION, Anan (JP)

(72) Inventors: Shota Murakami, Anan (JP); Norikazu Yano, Anan (JP); Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 714 days.

(21) Appl. No.: 18/065,587

(22) Filed: Dec. 13, 2022

(65) Prior Publication Data

US 2023/0187899 A1      Jun. 15, 2023

(30) Foreign Application Priority Data

Dec. 14, 2021    (JP) ................................ 2021-202725

(51) Int. Cl.
*H01S 5/0237* (2021.01)
*B23K 1/00* (2006.01)
(Continued)

(52) U.S. Cl.
CPC .......... *H01S 5/0237* (2021.01); *B23K 1/0016* (2013.01); *B23K 35/3013* (2013.01); *B23K 2101/40* (2018.08)

(58) Field of Classification Search
CPC .... H01S 5/02208; H01S 5/0233; H01S 5/022; H10H 29/852; H10H 20/852; H10H 20/857; H10H 20/8506; G01J 5/045
See application file for complete search history.

(56) References Cited

U.S. PATENT DOCUMENTS

| | | | |
|---|---|---|---|
| 2008/0179524 A1 | 7/2008 | Ichikawa | |
| 2008/0296719 A1* | 12/2008 | Ichikawa | .............. G01J 5/0875 |
| | | | 257/434 |
| 2022/0376156 A1* | 11/2022 | Miyahara | ........... H10H 20/8506 |

FOREIGN PATENT DOCUMENTS

| | | |
|---|---|---|
| JP | S51-15973 A | 2/1976 |
| JP | S62-62444 U | 4/1987 |

(Continued)

OTHER PUBLICATIONS

Nishimura_English (Year: 2014).*
Maruyama_English (Year: 2021).*
Kitamura_English (Year: 2011).*

*Primary Examiner* — Minsun O Harvey
*Assistant Examiner* — Alexander Ehrlich
(74) *Attorney, Agent, or Firm* — Spencer Fane LLP

(57) ABSTRACT

A manufacturing method of a light-emitting device includes: preparing a mounting substrate having a mounting surface, the mounting substrate including a first metal pattern arranged on a mounting surface side, a second metal pattern arranged on the mounting surface side inward of the first metal pattern in a plan view, and a third metal pattern arranged on the mounting surface side outward of the first metal pattern in the plan view; arranging a light-emitting element over the mounting surface of the mounting substrate; applying a bonding material to the first metal pattern; and joining a sealing member to at least the first metal pattern of the mounting substrate via the bonding material, the sealing member including a fourth metal pattern with a width greater than or equal to a width of the first metal pattern.

18 Claims, 14 Drawing Sheets

(51) Int. Cl.
   *B23K 35/30*        (2006.01)
   *B23K 101/40*       (2006.01)

(56)                References Cited

FOREIGN PATENT DOCUMENTS

| | | | | |
|---|---|---|---|---|
| JP | 2008-180629 | A | | 8/2008 |
| JP | 2008-298708 | A | | 12/2008 |
| JP | 2011253951 | A | * | 12/2011 |
| JP | 2014082452 | A | * | 5/2014 |
| JP | 2017-054856 | A | | 3/2017 |
| WO | 2021085071 | A1 | | 5/2021 |
| WO | WO-2021201290 | A1 | * | 10/2021 ............. H10F 77/00 |

* cited by examiner

MANUFACTURING METHOD OF LIGHT-EMITTING DEVICE, AND LIGHT-EMITTING DEVICE

CROSS-REFERENCE TO RELATED APPLICATION

This application claims priority to Japanese Patent Application No. 2021-202725, filed on Dec. 14, 2021, the disclosure of which is hereby incorporated herein by reference in its entirety.

BACKGROUND

The present disclosure relates to a manufacturing method of a light-emitting device, and a light-emitting device.

Japanese Patent Publication No. 2017-54856 discloses a technique of joining a substrate and a lid by using a soldering material. The Japanese Patent Publication No. 2017-54856 discloses a technique of using a third metal film and a fourth metal film to catch stray soldering material disposed between a first metal film provided on the substrate and a second metal film provided in the lid, the third metal film and the fourth metal film being disposed at a position where the soldering material lands.

SUMMARY

Methods for suppressing stray bonding material to improve the reliability of an apparatus have room for improvement.

A manufacturing method of a light-emitting device according to an embodiment includes: preparing a mounting substrate having a mounting surface, the mounting substrate including a first metal pattern arranged on a mounting surface side, a second metal pattern arranged on the mounting surface side inward of the first metal pattern in a plan view, and a third metal pattern arranged on the mounting surface side outward of the first metal pattern in the plan view; arranging a light-emitting element over the mounting surface of the mounting substrate; applying a bonding material to the first metal pattern; and joining a sealing member to at least the first metal pattern of the mounting substrate via the bonding material, the sealing member including a fourth metal pattern with a width greater than or equal to a width of the first metal pattern.

A light-emitting device according to an embodiment includes a mounting substrate, a light-emitting element and a sealing member. The mounting substrate has a mounting surface. The mounting substrate includes a first metal pattern arranged on a mounting surface side, a second metal pattern arranged on the mounting surface side inward of the first metal pattern in a plan view, and a third metal pattern arranged on the mounting surface side outward of the first metal pattern in the plan view. The light-emitting element is arranged over the mounting surface. The sealing member is joined to at least the first metal pattern of the mounting substrate via a joining member. The sealing member includes a fourth metal pattern with a width greater than or equal to a width of the first metal pattern.

At least one embodiment disclosed herein provides a highly reliable light-emitting device in which stray bonding material is suppressed.

DETAILED DESCRIPTION

Figure 1:
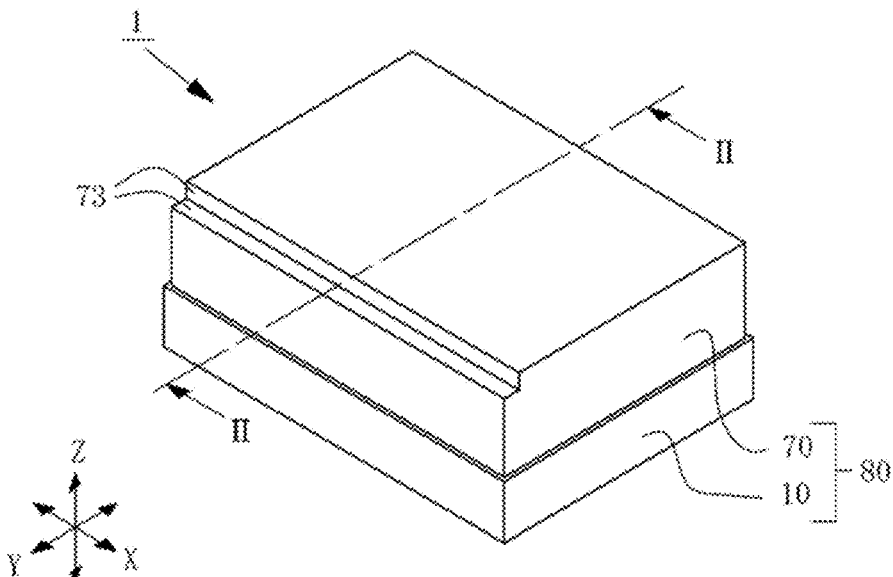
FIG. 1 is a perspective view of a light-emitting device according to an embodiment.

In the specification and the claims, polygons such as triangles and quadrangles, including shapes in which the corners of the polygon are rounded, chamfered, beveled, coved, or the like, are referred to as polygons. Furthermore, a shape obtained by processing not only the corners (ends of sides), but also an intermediate portion of a side is similarly referred to as a polygon. That is, a shape that is partially processed while remaining a basic polygon is included in the interpretation of "polygon" described in the specification and the claims.

The same applies not only to polygons but also to words representing specific shapes such as trapezoids, circles, protrusions, and recesses. Furthermore, the same applies when dealing with each side forming that shape. That is, even if processing is performed on a corner or an intermediate portion of a certain side, the interpretation of "side" includes the processed portion. Note that when a "polygon" or "side" not partially processed is to be distinguished from a processed shape, "strict" will be added to the description as in, for example, "quadrangle in a strict sense".

Furthermore, in the specification and the claims, descriptions such as upper and lower, left and right, top and bottom, front and back, near and far, and the like are used merely to describe the relative relationship of positions, orientations, directions, and the like, and the expressions need not necessarily match an actual relationship at the time of use.

In the drawings, directions such as an X direction, a Y direction, and a Z direction may be indicated by using arrows. The directions of the arrows are the same across multiple drawings of the same embodiment.

Further, "member" and "portion" may be described when, for example, a component and the like are described in this specification. The term "member" refers to an object physically treated alone. The object physically treated alone can be an object treated as one part in a manufacturing step. On the other hand, the term "portion" refers to an object that may not be physically treated alone. For example, the term "portion" is used when a part of one member is partially regarded.

Note that the distinction between "member" and "portion" described above does not indicate an intention to consciously limit the scope of rights in interpretation of the doctrine of equivalents. In other words, even when there is a component described as "member" in the claims, this does not mean that the applicant recognizes that physically treating the component alone is essential in the application of the present invention.

Furthermore, in the specification and the claims, when there are a plurality of components and each of these components is to be indicated separately, the components may be distinguished by adding the terms "first" and "second" at the beginning of the name of the component. Further, objects to be distinguished may differ between the specification and the claims. Thus, even when a component in the claims is given the same term as that in the specification, the object indicated by that component may not be the same across the specification and the claims.

For example, when there are components distinguished by being termed "first", "second", and "third" in the specification, and when components given the terms "first" and "third" in the specification are described in the claims, these components may be distinguished by being denoted as "first" and "second" in the claims for ease of understanding. In this case, the components denoted as "first" and "second" in the claims refer to the components termed "first" and "third" in the specification, respectively. Note that this rule is not limited to components and also applies to other objects in a reasonable and flexible manner.

Embodiments for implementing the present invention will be described below. Furthermore, specific embodiments for implementing the present invention will be described below with reference to the drawings. Note that embodiments for implementing the present invention are not limited to the specific embodiments. In other words, the illustrated embodiments do not disclose only one form in which the present invention is realized, and disclose an exemplary form. Note that sizes, positional relationships, and the like of members illustrated in the drawings may sometimes be exaggerated in order to facilitate understanding.

Embodiment

Figure 2:
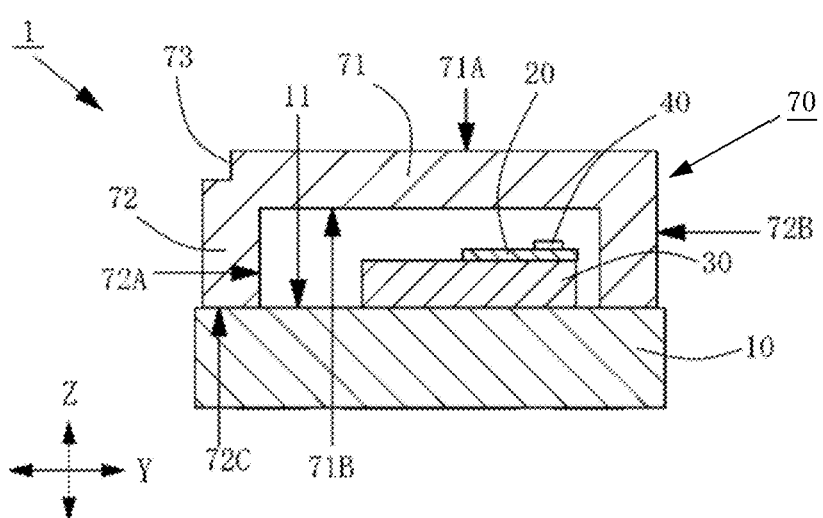
FIG. 2 is a sectional view taken along the line II-II in FIG. 1.
Figure 3:
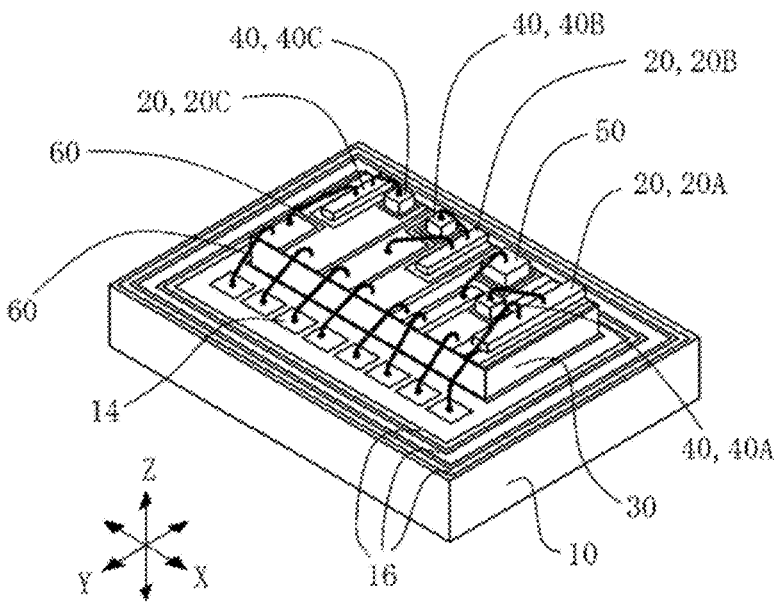
FIG. 3 is a perspective view of the light-emitting device according to the embodiment in a state in which a sealing member is not mounted.
Figure 4:
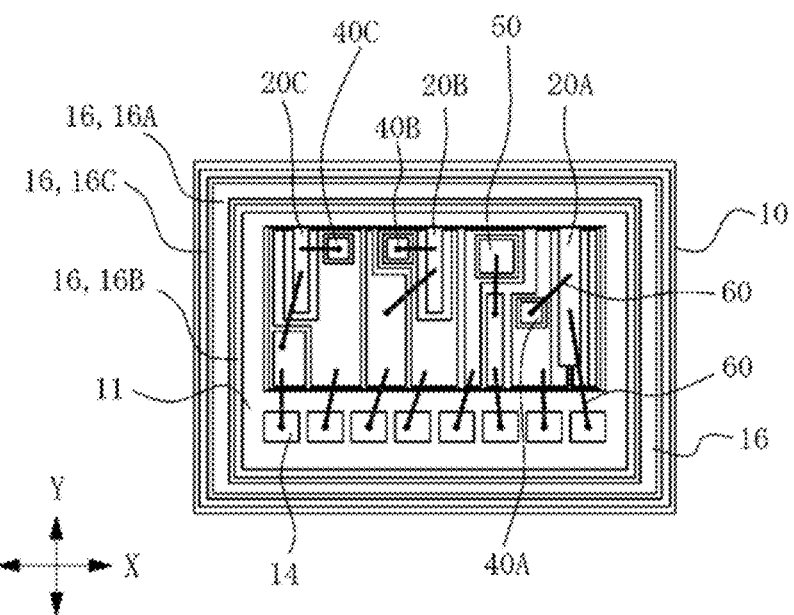
FIG. 4 is a top view of the light-emitting device according to the embodiment in the state in which the sealing member is not mounted.
Figure 5:
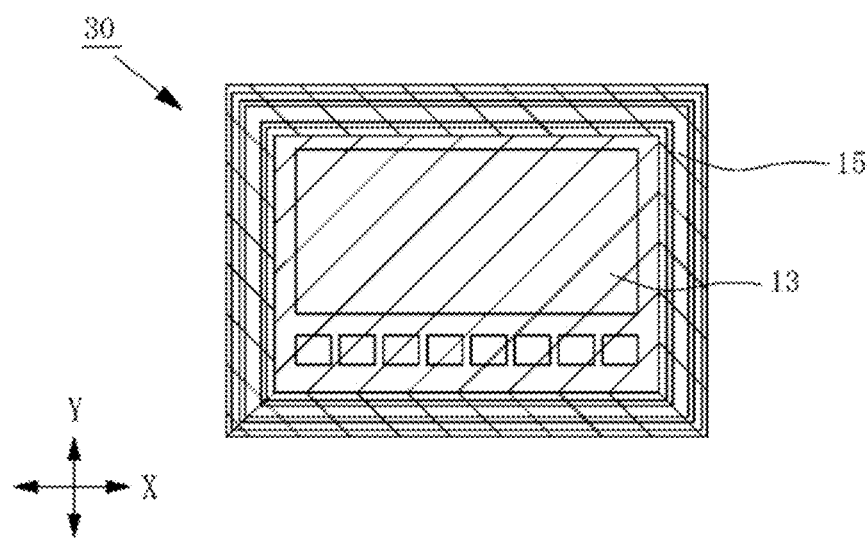
FIG. 5 is a top view of a mounting substrate according to the embodiment.
Figure 6:
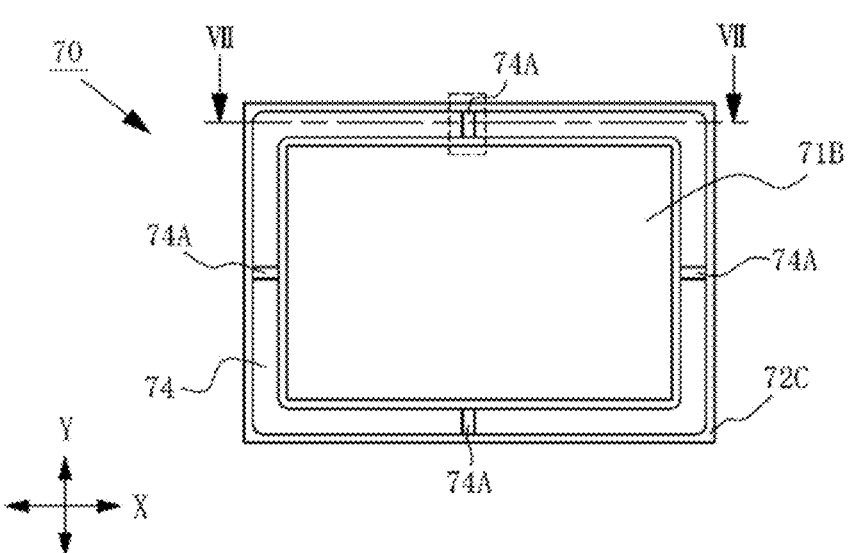
FIG. 6 is a bottom view of a sealing member according to the embodiment.
Figure 7:
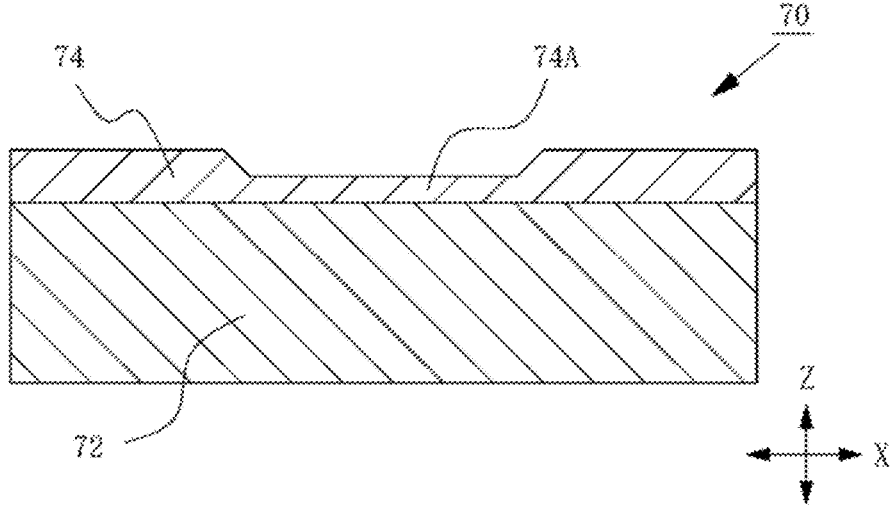
FIG. 7 is a partial sectional view taken along the line VII-VII in FIG. 6.
Figure 8:
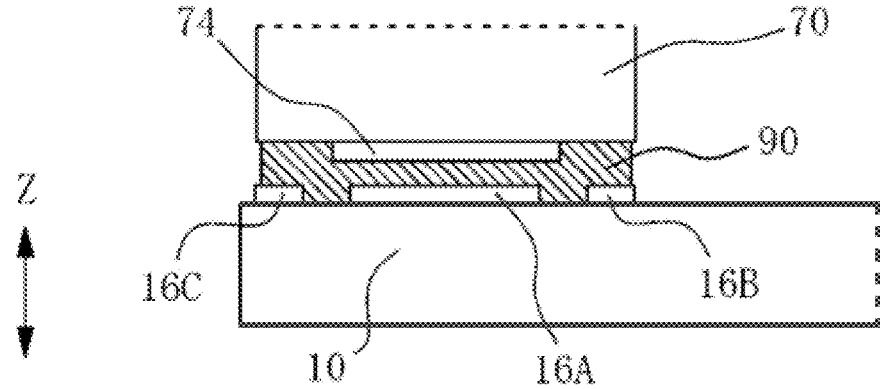
FIG. 8 is a schematic diagram illustrating an example of a joining position between a metal pattern of the mounting substrate and a metal pattern of the sealing member according to the embodiment.
Figure 9:
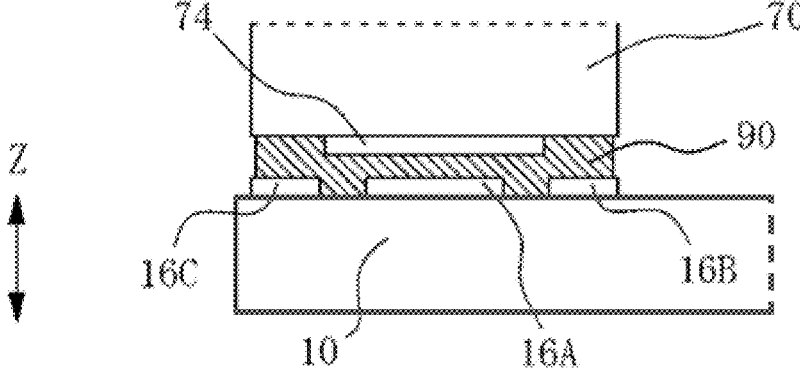
FIG. 9 is a schematic diagram illustrating another example of a joining position between the metal pattern of the mounting substrate and the metal pattern of the sealing member according to the embodiment.
Figure 10:
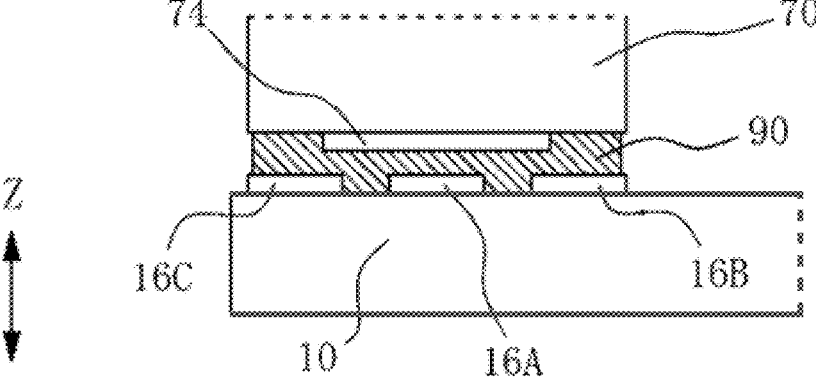
FIG. 10 is a schematic diagram illustrating another example of a joining position between the metal pattern of the mounting substrate and the metal pattern of the sealing member according to the embodiment.

A light-emitting device 1 according to an embodiment is described below. FIGS. 1 to 10 are schematic diagrams for describing the light-emitting device 1. FIG. 1 is a perspective view of the light-emitting device 1. FIG. 2 is a sectional view of the light-emitting device 1 taken along the line II-II in FIG. 1. FIG. 3 is a perspective view of the light-emitting device 1 in a state where a sealing member 70 is not mounted. FIG. 4 is a top view corresponding to FIG. 3. FIG. 5 is a top view of a mounting substrate 10. FIG. 6 is a bottom view of the sealing member 70. FIG. 7 is a partial sectional view of a portion surrounded by the broken line and taken along the line VII-VII in FIG. 6. FIGS. 8 to 10 are schematic views illustrating an exemplary state where the mounting substrate 10 and the sealing member 70 are joined. In FIGS. 8 to 10, only a joining member 90 is hatched for the sake of clarity.

The light-emitting device 1 includes a plurality of components. The plurality of components include the mounting substrate 10, one or a plurality of light-emitting elements 20, a submount 30, one or a plurality of protective elements 40, a temperature measuring element 50, a wiring line 60, and the sealing member 70.

Note that the light-emitting device 1 may include a component other than the components described above. For example, the light-emitting device 1 may include a light-emitting element other than the light-emitting element 20, a submount other than the submount 30, a lens, micro electro mechanical systems (MEMS), and the like. The light-emitting device 1 may not include some of the components described above. First, each of the components will be described.

Mounting Substrate 10

The mounting substrate 10 includes an upper surface 11, a lower surface, and one or a plurality of outer surfaces. The mounting substrate 10 has a plate shape. The mounting substrate 10 has a cuboid shape. Note that the mounting substrate 10 may have a shape other than a plate shape or a cuboid shape.

In a top view, the outer edge shape of the mounting substrate 10 is rectangular. This rectangular shape may be a shape with long sides and short sides. In the mounting substrate 10 illustrated in the drawings, the long side direction of the rectangular shape is the same as the X direction, and the short side direction of the rectangular shape is the same as the Y direction. Note that in the top view, the outer edge shape of the mounting substrate 10 may not be rectangular.

In the top view, the length of the outer edge of the mounting substrate 10 in the long side direction is within a range from 3 mm to 15 mm. In the top view, the length of the outer edge of the mounting substrate 10 in the short side direction is within a range from 1 mm to 6 mm. Note that the size of the outer edge of the mounting substrate 10 is not limited to these ranges.

One or more of the other components are mounted at the upper surface 11 of the mounting substrate 10. The upper surface 11 may be referred to as a mounting surface. On the upper surface 11 side (mounting surface side), the mounting substrate 10 includes a first mounting region 13 and a second mounting region 15. In a top view, the first mounting region 13 is surrounded by the second mounting region 15. The first mounting region 13 is provided at the upper surface 11. The second mounting region 15 is provided at the upper surface 11.

One or a plurality of wiring patterns 14 are provided at the mounting surface of the mounting substrate 10. The one or a plurality of wiring patterns 14 are provided in the first mounting region 13. The wiring pattern 14 is electrically connected to a wiring pattern provided at the lower surface of the mounting substrate 10 through wiring extending through the mounting substrate 10. Note that the wiring pattern electrically connected to the wiring pattern 14 may be provided at a surface other than the lower surface of the mounting substrate 10. For example, the upper surface 11 of the mounting substrate 10 may be expanded to the outside of the second mounting region 15, and the wiring pattern may be provided outside the second mounting region 15.

A plurality of the wiring patterns 14 may be provided at the mounting substrate 10. The plurality of wiring patterns 14 are disposed side by side in one direction at the upper surface 11 of the mounting substrate 10. In the mounting substrate 10 illustrated in the drawings, the plurality of wiring patterns 14 are disposed side by side in the X direction.

A plurality of metal patterns 16 for joining is provided in the second mounting region 15. The metal patterns 16 surround the first mounting region 13. The plurality of metal patterns 16 include a first metal pattern 16A, a second metal pattern 16B, and a third metal pattern 16C. The second metal pattern 16B is provided inward of the first metal pattern 16A in the plan view. The third metal pattern 16C is provided outward of the first metal pattern 16A in the plan view.

Each of the plurality of metal patterns 16 has an annular shape in a top view. In the mounting substrate 10 illustrated in the drawings, the metal pattern 16 is provided in a rectangular annular shape. Each metal pattern 16 has a predetermined width. In addition, as illustrated, each metal pattern 16 has a constant width except at the corners. When the metal pattern 16 has a rectangular annular shape, the width of the metal pattern 16 at each corner is greater than or equal to a constant width of a portion other than the corner, and less than or equal to a value obtained by multiplying the constant width by the square root of two. In the following description, the term "constant" includes a case in which a constant size is maintained except at local portions, as described above. In addition, the size of the width is specified excluding varied portions such as locally large or small portions due to the shape of the pattern. For example, a pattern having a rectangular annular shape and a width of 100 μm does not mean that the width at the corner is 100 μm because the width varies to a value obtained by multiplying 100 μm by the square root of two at the corner. In addition, for example, a certain pattern with a width described as greater than or equal to 100 μm or less than or equal to 100 μm does not mean a case in which the maximum width is greater than or equal to 100 μm or is less than or equal to 100 μm at a local portion but is less than 100 μm or greater than 100 μm except at such local portions.

The first metal pattern 16A is formed with a width in a range greater than or equal to 100 μm and less than 200 μm. The first metal pattern 16A is formed with a thickness (size in the vertical direction) in a range from 0.1 μm to 50 μm. The second metal pattern 16B is formed with a width in a range greater than 50 μm and less than or equal to 100 μm. The second metal pattern 16B is formed with a thickness in a range from 0.1 μm to 50 μm. The third metal pattern 16C is formed with a width in a range greater than 50 μm and less than or equal to 100 μm. The third metal pattern 16C is formed with a thickness in a range from 0.1 μm to 50 μm.

The second metal pattern 16B is provided at a position spaced apart from the first metal pattern 16A by a distance in a range from 30 μm to 200 μm. The second metal pattern 16B is provided at a constant distance from the first metal pattern 16A. As a specific example, this distance may be 50 μm±5 μm.

The third metal pattern 16C is provided at a position spaced apart from the first metal pattern 16A by a distance in a range from 30 μm to 200 μm. The third metal pattern 16C is provided at a constant distance from the first metal pattern 16A. As a specific example, this distance may be 50 μm±5 μm.

The width of the first metal pattern 16A is greater than or equal to the width of the second metal pattern 16B. The width of the first metal pattern 16A is greater than or equal to the width of the third metal pattern 16C. The width of the second metal pattern 16B is equal to the width of the third metal pattern 16C.

The width from the second metal pattern 16B to the third metal pattern 16C is less than or equal to 500 μm. More specifically, the width from the second metal pattern 16B to the third metal pattern 16C is equal to the sum of the width of the first metal pattern 16A, the width of the second metal pattern 16B, the width of the third metal pattern 16C, the distance from the first metal pattern 16A to the second metal pattern 16B, and the distance from the first metal pattern 16A to the third metal pattern 16C.

The mounting substrate 10 can be formed using ceramic as the main material. Examples of the ceramic include aluminum nitride, silicon nitride, aluminum oxide, and silicon carbide. Note that the mounting substrate 10 may be formed of a material other than ceramic.

Here, the main material refers to a material that occupies the greatest ratio of a target resultant product in terms of weight or volume. Note that, when a target resultant product is formed of one material, that material is the main material. In other words, when a certain material is the main material, the percentage of that material may be 100%.

Light-Emitting Element 20

The light-emitting element 20 includes a light exit surface that emits light. The light-emitting element 20 includes an upper surface, a lower surface, and a plurality of lateral surfaces. Each lateral surface of the light-emitting element 20 can serve as the light exit surface. Note that another surface may serve as the light exit surface. Further, a plurality of surfaces may serve as the light exit surface.

A semiconductor laser element can be employed for the light-emitting element 20. Note that the light-emitting element 20 is not limited to a semiconductor laser element, and a light-emitting diode or the like may be employed.

As the light-emitting element 20, for example, a light-emitting element that emits blue light, a light-emitting element that emits green light, or a light-emitting element that emits red light can be employed. Note that a light-emitting element that emits light of another color or emission peak wavelength may be employed as the light-emitting element 20. For example, a light-emitting element that emits infrared light may be employed as the light-emitting element 20.

Blue light refers to light having an emission peak wavelength within a range from 420 nm to 494 nm. Green light refers to light having an emission peak wavelength within a range from 495 nm to 570 nm. Red light refers to light having an emission peak wavelength within a range from 605 nm to 750 nm.

Here, a semiconductor laser element being an example of the light-emitting element 20 will be described. The semiconductor laser element has a rectangular external shape having one set of opposite sides as long sides and another set of opposite sides as short sides in a top view. Light (laser light) emitted from the semiconductor laser element spreads. Further, divergent light is emitted from an emission end surface of the semiconductor laser element. The emission end surface of the semiconductor laser element can be referred to as the light exit surface of the light-emitting element 20.

The light emitted from the semiconductor laser element forms a far field pattern (hereinafter referred to as an "FFP") of an elliptical shape in a plane parallel to the emission end surface of the light. The FFP indicates a shape and a light intensity distribution of the emitted light at a position spaced apart from the emission end surface.

Here, light passing through the center of the elliptical shape of the FFP, in other words, light having a peak intensity in the light intensity distribution of the FFP is referred to as light traveling on an optical axis or light passing through an optical axis. Based on the light intensity distribution of the FFP, light having an intensity of $1/e^2$ or more with respect to a peak intensity value is referred to as a main portion of the light.

The shape of the FFP of the light emitted from the semiconductor laser element is an elliptical shape in which the light in a layering direction is longer than in a direction perpendicular to the layering direction in the plane parallel to the emission end surface of the light. The layering direction is a direction in which a plurality of semiconductor layers including an active layer are layered in the semiconductor laser element. The direction perpendicular to the layering direction can also be referred to as a plane direction of the semiconductor layer. Further, a long diameter direction of the elliptical shape of the FFP can also be referred to as a fast axis direction of the semiconductor laser element, and a short diameter direction can also be referred to as a slow axis direction of the semiconductor laser element.

Based on the light intensity distribution of the FFP, an angle at which light having a light intensity of $1/e^2$ of a peak light intensity spreads is referred to as a spread angle of light of the semiconductor laser element. For example, the spread angle of light can also be determined based on the light intensity that is half of the peak light intensity in addition to being determined based on the light intensity of $1/e^2$ of the peak light intensity. In the description herein, the term "spread angle of light" by itself refers to a spread angle of light at the light intensity of $1/e^2$ of the peak light intensity. Note that it can be said that a spread angle in the fast axis direction is greater than a spread angle in the slow axis direction.

Examples of the semiconductor laser element that emits blue light or the semiconductor laser element that emits green light include a semiconductor laser element including a nitride semiconductor. GaN, InGaN, and AlGaN, for example, can be used as the nitride semiconductor. Examples of the semiconductor laser element that emits red light include a semiconductor laser element including an InAlGaP-based, GaInP-based, GaAs-based, or AlGaAs-based semiconductor.

Submount 30

The submount 30 includes an upper surface and a lower surface. Other components are placed on the upper surface of the submount 30. The submount 30 is an example of a placement member on which one or a plurality of components are placed. The upper surface of the submount 30 has a rectangular shape. The submount 30 is formed in a rectangular parallelepiped shape. The upper surface of the submount 30 may have a rectangular shape with short sides and long sides.

The submount 30 may be formed using, for example, silicon nitride, aluminum nitride, or silicon carbide as the main material. A wiring region formed of a conductive material is provided on the upper surface of the submount 30. The wiring region can be formed of a metal film. Examples of the metal film include a Ti/Pt/Au film.

Protective Element 40

The protective element 40 prevents breakage of a specific element (e.g., the light-emitting element) due to an excessive current flowing through the element. The protective element 40 is a Zener diode, for example. Further, a Zener diode formed of Si can be used as the Zener diode. The protective element 40 has a substantially square shape in a top view. Note that the shape of the protective element 40 is not limited to this.

Temperature Measuring Element 50

The temperature measuring element 50 is an element utilized as a temperature sensor for measuring the ambient temperature. For example, a thermistor can be used as the temperature measuring element 50. The temperature measuring element 50 has a substantially square shape in a top view. Note that the shape of the temperature measuring element 50 is not limited to this.

Wiring Line 60

The wiring line 60 is composed of a conductive material with a linear shape. The wiring line 60 is joined to other components at both ends of the linear portion. The wiring line 60 is used for electrical connection between two components. For example, a metal wire can be used as the wiring line 60. Examples of the metal include gold, aluminum, silver, and copper.

Sealing Member 70

The sealing member 70 includes an upper portion 71 and a lateral wall portion 72. The upper portion 71 includes an upper surface 71A and a lower surface 71B. The lateral wall portion 72 includes one or a plurality of inner surfaces 72A, one or a plurality of outer surfaces 72B, and a lower surface 72C. The lateral wall portion 72 has a frame shape. The sealing member 70 includes a recessed surface 73.

The lower surface 72C of the lateral wall portion 72 is located below the lower surface 71B of the upper portion 71. In a bottom view, the lower surface 71B of the upper portion 71 is surrounded by the inner surface 72A of the lateral wall portion 72. In a top view, the upper surface 71A of the upper portion 71 is surrounded by the outer surface 72B of the lateral wall portion 72.

A portion of an outer edge of the recessed surface 73 intersects a portion of an outer edge of the upper surface 71A of the upper portion 71. Another portion of the outer edge of the recessed surface 73 makes up a portion of the outer edge of the sealing member 70 in the top view. Another portion of the outer edge of the upper surface 71A of the upper portion 71 makes up a portion of the outer edge of the sealing member 70 in the top view. The recessed surface 73 is formed along one side of the outer edge of the upper surface 71A of the upper portion 71.

In the top view, the external shape of the sealing member 70 is rectangular. In the top view, the external shape of the upper surface 71A of the upper portion 71 is a rectangular shape with long sides and short sides. The recessed surface 73 is connected to the outer surface 72B of the lateral wall portion 72 and the upper surface 71A of the upper portion 71. The recessed surface 73 is located outside a frame defined by the one or a plurality of inner surfaces of the lateral wall portion 72 in the top view. The recessed surface 73 is formed along a long side of the upper surface 71A of the upper portion 71.

A metal pattern 74 is provided at the lower surface 72C of the sealing member 70. The metal pattern 74 is provided in an annular shape with respect to the lower surface 72C with an annular shape. In the sealing member 70 illustrated in the drawings, the metal pattern 74 with a rectangular annular shape is provided with respect to the lower surface 72C with a rectangular annular shape.

The metal pattern 74 includes a thin portion 74A with a smaller thickness than other portions. A plurality of the thin portions 74A may be provided in the metal pattern 74. Each thin portion 74A is provided in a region corresponding to each side of the rectangular shape in the metal pattern 74 with a rectangular annular shape. A region corresponding to a side means a portion, including the side, in which the metal pattern 74 is formed with a predetermined width from the side. The thin portion 74A is provided at a position passing through the center of the side.

The thin portion 74A is provided along the width of the metal pattern 74. The thin portion 74A is provided in the width direction from the inner edge to the outer edge that forms the annular shape. Instead of the metal pattern 74 including the thin portion 74A, a plurality of metal patterns separated by a portion corresponding to the thin portion 74A may also be employed.

The metal pattern 74 is provided with a width smaller than the width of the lower surface 72C, at the lower surface 72C. The metal pattern 74 is spaced apart from the inner edge of the lower surface 72C of the sealing member 70 by a distance of greater than or equal to 50 μm. In addition, the metal pattern 74 is spaced apart from the inner edge of the lower surface 72C by a distance less than 50% of the width of the lower surface 72C.

The metal pattern 74 is spaced apart from the outer edge of the lower surface 72C of the sealing member 70 by a distance of greater than or equal to 50 μm. In addition, the metal pattern 74 is spaced apart from the outer edge of the lower surface 72C by a distance less than 50% of the width of the lower surface 72C.

In a case in which the metal pattern 74 is used as a joint region, the metal pattern 74 is preferably spaced apart from the inner edge of the lower surface 72C of the sealing member 70 by a distance in a range from 50 μm to 150 μm, and the width of the metal pattern 74 is preferably greater than or equal to 100 μm. Note that the maximum width of the metal pattern 74 in this case is a length obtained by subtracting, from the width of the lower surface 72C, the distance from the inner edge of the sealing member 70 to the metal pattern 74. As described in detail later, providing the metal pattern 74 a predetermined distance from the inner edge of the sealing member 70 can suppress extension of the metal pattern 74 to the lower surface 71B and/or the inner surface 72A and the formation of unnecessary metal patterns at the lower surface 71B and/or the inner surface 72A.

Light-Emitting Device 1

Subsequently, the light-emitting device 1 including the above-described components will be described.

In the light-emitting device 1, the one or a plurality of light-emitting elements 20 are mounted at the submount 30. The one or a plurality of light-emitting elements 20 is mounted at the upper surface of the submount 30. The one or a plurality of light-emitting elements 20 is disposed with the light exit surface facing the lateral side. In the light-emitting device 1 illustrated in the drawings, the upper surface of the submount 30 is parallel to the X direction and the Y direction.

The light exit surface of the light-emitting element 20 is disposed near the lateral surface of the submount 30. The light-emitting element 20 is disposed such that the light of a principal portion emitted from the light-emitting element 20 does not impinge on the upper surface of the submount 30. This lateral surface intersects a long side of the upper surface of the submount 30.

The light-emitting device 1 may include the plurality of light-emitting elements 20. Hereinafter, when the plurality of light-emitting elements 20 are individually identified and described, the light-emitting elements 20 are distinguished as a first light-emitting element and a second light-emitting element. The light-emitting device 1 may include the plurality of light-emitting elements 20 that each emit light of different colors.

The light-emitting device 1 illustrated in the drawings includes a first light-emitting element 20A, a second light-emitting element 20B, and a third light-emitting element 20C. The first light-emitting element 20A, the second light-emitting element 20B, and the third light-emitting element 20C are disposed on the upper surface of the submount 30.

The first light-emitting element 20A emits first light having a peak wavelength at a first wavelength, the second light-emitting element 20B emits second light having a peak wavelength at a second wavelength different from the first wavelength, and the third light-emitting element 20C emits third light having a peak wavelength at a third wavelength different from the first wavelength and the second wavelength. For example, the first light-emitting element 20A emits red light, the second light-emitting element 20B emits green light, and the third light-emitting element 20C emits blue light.

The plurality of light-emitting elements 20 are disposed side by side so that each light exit surface faces the same direction. Note that here, the same direction includes a case in which the angle between adjacent light exit surfaces of the light-emitting elements 20 is within ±5 degrees. In the light-emitting device 1 illustrated in the drawings, the direction (first direction) in which a plurality of the light-emitting elements 20 are disposed side by side is the same direction as the X direction.

The light emitted from the light exit surface of the light-emitting element 20 includes light traveling in a direction perpendicular to the light exit surface. In the light-emitting device 1, the direction perpendicular to the light exit surface is parallel to the upper surface of the submount 30. Note that the term "parallel" used here includes a case of a range within ±3 degrees. When the light-emitting element 20 is a semiconductor laser element, the light traveling on the optical axis in the semiconductor laser element may be light traveling in the direction perpendicular to the light exit surface.

The light emitted from the light exit surface of the light-emitting element 20 includes light traveling in a direction (second direction) perpendicular to the first direction in a top view. In the light-emitting device 1, the second direction is parallel to the upper surface of the submount 30. Note that the term "parallel" used here includes a case of a range within ±3 degrees.

In the light-emitting device 1 illustrated in the drawings, the direction perpendicular to the light exit surface is the same direction as the Y direction. The light-emitting element 20 is the semiconductor laser element, and the optical axis of the light emitted from the semiconductor laser element is the same direction as the Y direction.

In a top view, the length of the upper surface of the submount 30 in the second direction is smaller than the length of the upper surface in the first direction. In the light-emitting device 1 illustrated in the drawings, the first light-emitting element 20A, the second light-emitting element 20B, and the third light-emitting element 20C are disposed side by side in this order in the first direction. In other words, the second light-emitting element 20B is disposed between the first light-emitting element 20A and the third light-emitting element 20C.

The plurality of light-emitting elements 20 are disposed side by side at even intervals in the first direction. Note that the interval between the light-emitting elements 20 is measured based on the center of the light exit surface of each light-emitting element 20.

In the light-emitting device 1, the one or a plurality of protective elements 40 are mounted on the submount 30. The one or a plurality of protective elements 40 are mounted on the upper surface of the submount 30.

The light-emitting device 1 can include a plurality of protective elements 40. Hereinafter, when the plurality of protective elements 40 are described individually, the protective elements 40 are distinguished as a first protective element and a second protective element.

The protective element 40 is provided to protect the light-emitting element 20. The light-emitting device 1 may include the same number of protective elements 40 as the number of light-emitting elements 20. The light-emitting device 1 illustrated in the drawings includes a first protective element 40A, a second protective element 40B, and a third protective element 40C disposed on the upper surface of the submount 30. The first protective element 40A is the protective element 40 corresponding to the first light-emitting element 20A, that is, the protective element 40 provided to protect the first light-emitting element 20A. The second protective element 40B is the protective element 40 corresponding to the second light-emitting element 20B. The third protective element 40C is the protective element 40 corresponding to the third light-emitting element 20C.

In a top view, the first protective element 40A is disposed between the first light-emitting element 20A and the second light-emitting element 20B. In a top view, the second protective element 40B and the third protective element 40C are disposed between the second light-emitting element 20B and the third light-emitting element 20C. When the protective elements 40 are disposed in the above-described manner, the submount 30 can be downsized.

In the light-emitting device 1, the temperature measuring element 50 is mounted at the submount 30. The temperature measuring element 50 is mounted on the upper surface of the submount 30. In a top view, the temperature measuring element 50 is disposed between the first light-emitting element 20A and the second light-emitting element 20B. The first protective element 40A and the temperature measuring element 50 are spaced apart from each other in the second direction.

In the light-emitting device 1, the wiring line 60 is joined to the wiring region of the submount 30 and the light-emitting element 20 placed on the submount 30. The wiring line 60 is joined to the light-emitting element 20 placed on the submount 30 and the protective element 40 placed on the submount 30. The wiring line 60 is joined to the wiring region of the submount 30 and the temperature measuring element 50 placed on the submount 30.

In the light-emitting device 1, the submount 30 is disposed on the upper surface 11 of the mounting substrate 10. The submount 30 is joined to the mounting substrate 10 by an adhesive. The submount 30 is disposed in the first mounting region 13 of the mounting substrate 10.

Note that the one or a plurality of light-emitting elements 20 may be disposed on the mounting surface of the mounting substrate 10 with no submount 30 therebetween. In this case, for example, the mounting substrate having a shape such like the submount 30 is disposed on the mounting substrate 10 can be provided.

The light-emitting element 20 emits light that travels laterally with respect to the upper surface of the mounting substrate 10. The light traveling in the second direction from the light-emitting element 20 travels in a direction away from the wiring pattern 14.

With regard to the first direction, the length from end to end of the one or a plurality of wiring patterns 14 is within a range from 90% to 110% of the length from end to end of the submount 30. When these two lengths are substantially the same, the light-emitting device 1 can be manufactured in a small size.

In the light-emitting device 1, the sealing member 70 is disposed on the mounting substrate 10. The sealing member 70 is joined to the mounting substrate 10 at the second mounting region 15. The lower surface 71B of the sealing member 70 is joined to the upper surface 11 of the mounting substrate 10. The lower surface 71B of the sealing member 70 and the upper surface 11 of the mounting substrate 10 may be referred to as joint surfaces. The metal pattern 74 of the sealing member 70 and the metal pattern 16 of the second mounting region 15 are joined.

The sealing member 70 is joined to the first metal pattern 16A of the mounting substrate 10 via a bonding material. Further, the sealing member 70 is joined to the second metal pattern 16B and the third metal pattern 16C via a bonding material. For example, the sealing member 70 can be joined to the mounting substrate 10 by joining the metal pattern 74 and the metal pattern 16 by the bonding material by using a solder such as AuSn as the bonding material.

The metal pattern 74 of the sealing member 70 has a width greater than or equal to the width of the first metal pattern 16A of the mounting substrate 10. Preferably, the width of the metal pattern 74 is greater than the width of the first metal pattern 16A. With this configuration, the metal pattern 74 of the sealing member 70 and the plurality of metal patterns 16 of the mounting substrate 10 are stably joined.

In a top view, the first metal pattern 16A is located between the inner edge of the metal pattern 74 and the outer edge of the metal pattern 74. In a top view, the metal pattern 74 covers the first metal pattern 16A. In a top view, the sealing member 70 is joined to the mounting substrate 10 such that the center of the width of the metal pattern 74 and the center of the width of the first metal pattern 16A overlap. Here, the centers may not precisely overlap each other and may be shifted to a certain degree as long as the centers substantially overlap each other. For example, even if these centers match in an ideal design, it is normal for some errors to occur in actual manufacturing.

The light-emitting device 1 is manufactured without the bonding material protruding beyond the joint surface of the sealing member 70 in the plan view. Here, when the mounting substrate 10 and the sealing member 70 are joined and the bonding material is cured, the bonding material in this state is referred to as the joining member 90. In the light-emitting device 1, the joining member 90 is formed without protruding from the lower surface 72C.

FIGS. 8 to 10 are schematic diagrams illustrating exemplary relationships between positions where the metal pattern 16 of the mounting substrate 10 and the metal pattern 74 of the sealing member 70 are joined. In a plan view perpendicular to the joint surface, the first metal pattern 16A of the mounting substrate 10 completely overlaps the metal pattern 74 of the sealing member 70.

As illustrated in FIG. 8, in a plan view perpendicular to the joint surface, the metal pattern 74 does not overlap the second metal pattern 16B and the third metal pattern 16C. The width of the metal pattern 74 is smaller than the distance from the second metal pattern 16B to the third metal pattern 16C. The width of the metal pattern 74 is less than or equal to the length of a line connecting the middle point of the distance from the first metal pattern 16A to the second metal pattern 16B and the middle point of the distance from the first metal pattern 16A to the third metal pattern 16C.

As illustrated in FIG. 9, the width of the metal pattern 74 does not exceed the distance from the second metal pattern 16B to the third metal pattern 16C. The width of the metal pattern 74 is greater than the length of a line connecting the middle point of the distance from the first metal pattern 16A to the second metal pattern 16B and the middle point of the distance from the first metal pattern 16A to the third metal pattern 16C.

As illustrated in FIG. 10, in a plan view perpendicular to the joint surface, the metal pattern 74 partially overlaps the second metal pattern 16B. The metal pattern 74 does not overlap all of the second metal pattern 16B. In addition, in a plan view perpendicular to the joint surface, the metal pattern 74 partially overlaps the third metal pattern 16C. The metal pattern 74 does not overlap all of the third metal pattern 16C. The width of the metal pattern 74 is greater than the distance from the second metal pattern 16B to the third metal pattern 16C.

Figure 11:
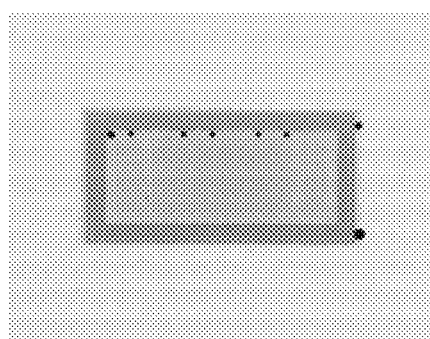
FIG. 11 is an image showing the state of the joining member in a light-emitting device of a comparative example.
Figure 12:
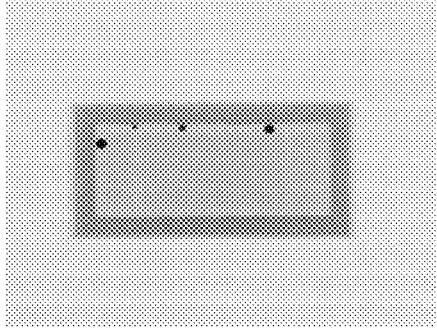
FIG. 12 is an image showing the state of the joining member in another light-emitting device of a comparative example.
Figure 13:
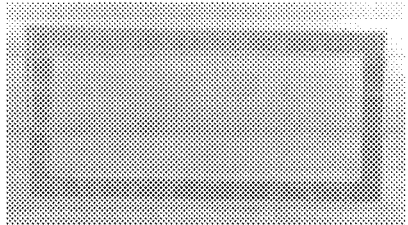
FIG. 13 is an image showing the state of the joining member in the light-emitting device according to the embodiment.
Figure 14:
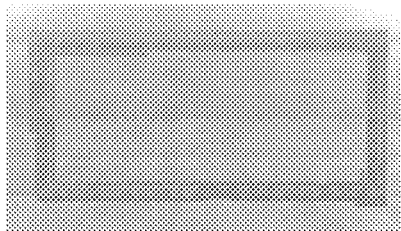
FIG. 14 is an image showing the state of the joining member in another light-emitting device according to the embodiment.
Figure 15:
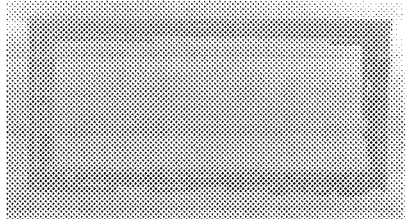
FIG. 15 is an image showing the state of the joining member in another light-emitting device according to the embodiment.

FIGS. 11 to 15 are images showing the state of the joining member in a light-emitting device of a comparative example and joining in the light-emitting device 1. FIGS. 11 and 12 are images showing the state of the joining member in the light-emitting device of the comparative example, and FIGS. 13 to 15 are images showing the state of the joining member in the light-emitting device according to the embodiment.

In the light-emitting device of the comparative example illustrated in FIGS. 11 and 12, two metal patterns were provided on the mounting substrate. The two metal patterns correspond to the first metal pattern 16A and the third metal pattern 16C provided outward of the first metal pattern 16A of the light-emitting device 1 according to the embodiment. In the light-emitting device illustrated in FIGS. 11 and 12, a bonding material was applied on the first metal pattern 16A or a metal pattern corresponding to the first metal pattern 16A to achieve joining with the sealing member. In the light-emitting device illustrated in FIGS. 13 to 15, a bonding material was applied on the first metal pattern 16A to achieve joining with the sealing member.

In the comparative example of FIG. 11, the width of the metal pattern corresponding to the first metal pattern 16A was 150 μm, the width of the metal pattern corresponding to the third metal pattern 16C was 50 μm, and the distance between these two metal patterns was 75 μm. In the comparative example of FIG. 12, the width of the metal pattern corresponding to the first metal pattern 16A was 150 μm, the width of the metal pattern corresponding to the third metal pattern 16C was 50 μm, and the distance between these two metal patterns was 50 μm. In the comparative examples of FIGS. 11 and 12, the width of the metal pattern of the sealing member was 240 μm.

In FIG. 13, the width of the first metal pattern 16A was 200 μm, the width of the second metal pattern 16B was 50 μm, the width of the third metal pattern 16C was 50 μm, the distance from the first metal pattern 16A to the second metal pattern 16B was 50 μm, and the distance from the first metal pattern 16A to the third metal pattern 16C was 50 μm. In addition, the width of the metal pattern 74 is 240 μm. In the light-emitting device 1 of FIG. 13, the relationship between the joining positions of the metal pattern 16 and the metal pattern 74 was as illustrated in FIG. 8.

In FIG. 14, the width of the first metal pattern 16A was 150 μm, the width of the second metal pattern 16B was 75 μm, the width of the third metal pattern 16C was 75 μm, the distance from the first metal pattern 16A to the second metal pattern 16B was 50 μm, and the distance from the first metal pattern 16A to the third metal pattern 16C was 50 μm. In addition, the width of the metal pattern 74 was 240 μm. In the light-emitting device 1 of FIG. 14, the relationship between the joining positions of the metal pattern 16 and the metal pattern 74 was as illustrated in FIG. 9.

In FIG. 15, the width of the first metal pattern 16A was 100 μm, the width of the second metal pattern 16B was 100 μm, the width of the third metal pattern 16C was 100 μm, the distance from the first metal pattern 16A to the second metal pattern 16B was 50 μm, and the distance from the first metal pattern 16A to the third metal pattern 16C was 50 μm. In addition, the width of the metal pattern 74 was 240 μm. In the light-emitting device 1 of FIG. 15, the relationship between the joining positions of the metal pattern 16 and the metal pattern 74 was as illustrated in FIG. 10.

In the light-emitting device of FIG. 11, circular bonding materials protrude from the inner edge of the sealing member. In addition, circular bonding materials also protrude also from the outer edge of the sealing member, but the number of the protruding circular bonding materials is smaller than that at the inner edge. In the light-emitting device of FIG. 12, the bonding material does not protrude from the outer edge of the sealing member, but circular bonding materials protrude from the inner edge of the sealing member. As such, in the light-emitting device of the comparative example provided with two metal patterns, the protrusion toward the outer edge is suppressed to some degree compared with protrusion toward the inner edge. On the other hand, in the light-emitting device 1 of FIGS. 13 to 15, the bonding material does not protrude from the inner edge or outer edge of the sealing member 70. In this manner, with the first metal pattern 16A, the second metal pattern 16B, and the third metal pattern 16C, stray bonding material from the inner edge and outer edge of the sealing member 70 can be suppressed.

In the light-emitting device 1 of FIGS. 13 to 15, the bonding material is joined in an annular shape with respect to the first metal pattern 16A having an annular shape. In addition, the bonding material is not joined in an annular shape, but is partially joined with respect to the second metal pattern 16B having an annular shape. In addition, the bonding material is not joined in an annular shape, but is partially joined with respect to the third metal pattern 16C having an annular shape. That is, the sealing member 70 is joined to the first metal pattern 16A, the second metal pattern 16B, and the third metal pattern 16C via the bonding material, but is not necessarily joined to the entire regions of these metal patterns 16.

When the mounting substrate 10 and the sealing member 70 are joined, a closed space is defined between the mounting substrate 10 and the sealing member 70. In other words, the mounting substrate 10 and the sealing member 70 form a package. In addition, the light-emitting element 20 is disposed in the space inside the package. Note that the package may be formed by joining a plate-like sealing member having an upper portion to a mounting substrate in which a substrate and a lateral wall portion are integrated with each other, for example.

The light emitted from the one or a plurality of light-emitting elements 20 passes through the lateral wall portion 72 of the package and is emitted from the outer surface. The light emitted from the one or a plurality of light-emitting elements 20 passes through the lateral wall portion 72 of the sealing member 70. The light emitted from the one or a plurality of light-emitting elements 20 is incident on one inner surface (first inner surface) of the lateral wall portion 72, and is emitted from one outer surface (first outer surface).

In the light-emitting device 1 illustrated in the drawings, the light emitted from the first light-emitting element 20A, the second light-emitting element 20B, and the third light-emitting element 20C is incident on the first inner surface of the lateral wall portion 72, and is emitted from the first outer surface of the lateral wall portion 72.

Note that the light emitted from the one or a plurality of light-emitting elements 20 may be emitted from the upper surface of the upper portion 71 to travel upward instead of being emitted from the outer surface of the package to travel laterally. For example, a reflective mirror may be disposed, and the light emitted from the one or a plurality of light-emitting elements 20 may be reflected by the reflective mirror to travel upward and be emitted from the upper surface of the upper portion 71.

The recessed surface 73 is formed along one side (opposite side) that is one side of the upper surface of the upper portion 71 and is located on a side opposite to one side intersecting the first outer surface. This side is a long side of the rectangular shape of the upper surface. The recessed surface 73 is connected to an outer surface (second outer surface) that is an outer surface of the lateral wall portion 72 and is located on a side opposite to the first outer surface, and to the upper surface of the upper portion 71. By providing the recessed surface 73 on the second outer surface side instead of the first outer surface side, the light exit surface can be determined and an orientation of the light-emitting device 1 can be determined based on the recessed surface 73.

Manufacturing Method of Light-Emitting Device 1

Here, a manufacturing method of the light-emitting device 1 is described. Note that in the process of manufacturing the light-emitting device 1, manufacturing can be achieved by mounting the components in the order described above in "Light-Emitting Device 1".

The manufacturing method of the light-emitting device 1 includes a step (first step) of preparing the mounting substrate 10, a step (second step) of arranging one or a plurality of components including the light-emitting element 20 to the mounting substrate 10, and a step (third step) of joining the sealing member 70 to the mounting substrate 10.

At the first step, the mounting substrate 10 in which the first metal pattern 16A, the second metal pattern 16B and the third metal pattern 16C are provided on the mounting surface side is prepared. At the second step, the one or a plurality of light-emitting elements 20 is disposed on the mounting surface of the mounting substrate 10. The one or a plurality of light-emitting elements 20 may be disposed via the submount 30, and the protective element 40 may be disposed at the mounting surface. In addition, the temperature measuring element 50 may be disposed at the mounting surface. In addition, the wiring line 60 is joined to the light-emitting element 20, the mounting substrate 10 or the like for the purpose of electrical connection.

At the third step, a bonding material is applied to the first metal pattern 16A of the mounting substrate 10. Then, the sealing member 70 is joined to the mounting substrate 10 via the bonding material applied to the first metal pattern 16A. By this joining process, the sealing member 70 is joined to the first metal pattern 16A, the second metal pattern 16B, and the third metal pattern 16C of the mounting substrate 10.

Here, a manufacturing method of the sealing member 70 used in the third step is further described. FIGS. 16A to 16I are schematic diagrams for describing a manufacturing method of the sealing member 70 provided with the metal pattern 74.

The manufacturing method of the sealing member 70 provided with the metal pattern 74 includes a step (fourth step) of installing a fitting base material 101 provided with a plurality of recesses, a step (fifth step) of fitting the sealing member 70 provided with no metal pattern 74 (hereinafter referred to as "base material 80") to each of the plurality of recesses, a step (sixth step) of installing a mask member 102 on a plurality of the base materials 80, and a step (seventh step) of providing the metal pattern 74 to the plurality of the base materials 80.

Figure 16A:
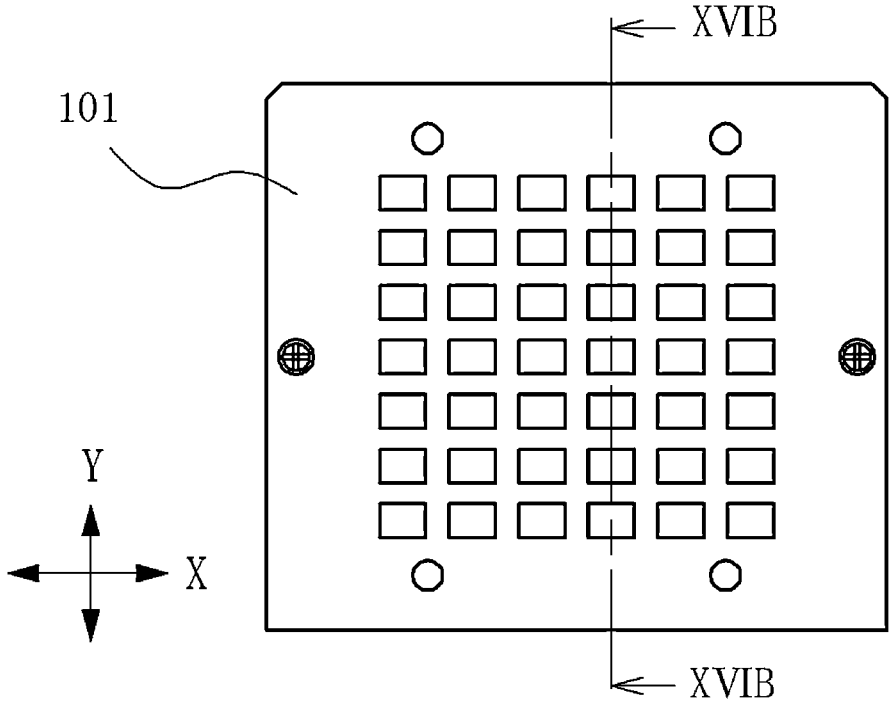
FIG. 16A is a top view for describing a manufacturing method of the sealing member according to the embodiment.
Figure 16B:
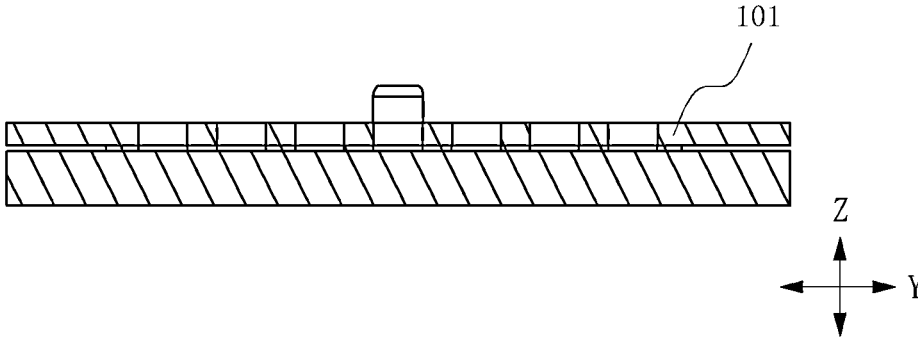
FIG. 16B is a sectional view taken along the line XVIB-XVIB in FIG. 16A.

In the fourth step, the fitting base material 101 is installed (see FIGS. 16A and 16B). The fitting base material 101 can be installed by placing a fitting plate provided with a plurality of through holes on a base material and fixing the fitting plate with a screw. A recess is formed by the flat surface of the base material and the through hole of the fitting plate. With the fitting base material 101, a plurality of rows of a plurality of recesses arranged in the row direction are provided in a plan view. The fitting base material 101 illustrated in the drawings is provided with a plurality of recesses in a matrix.

Figure 16C:
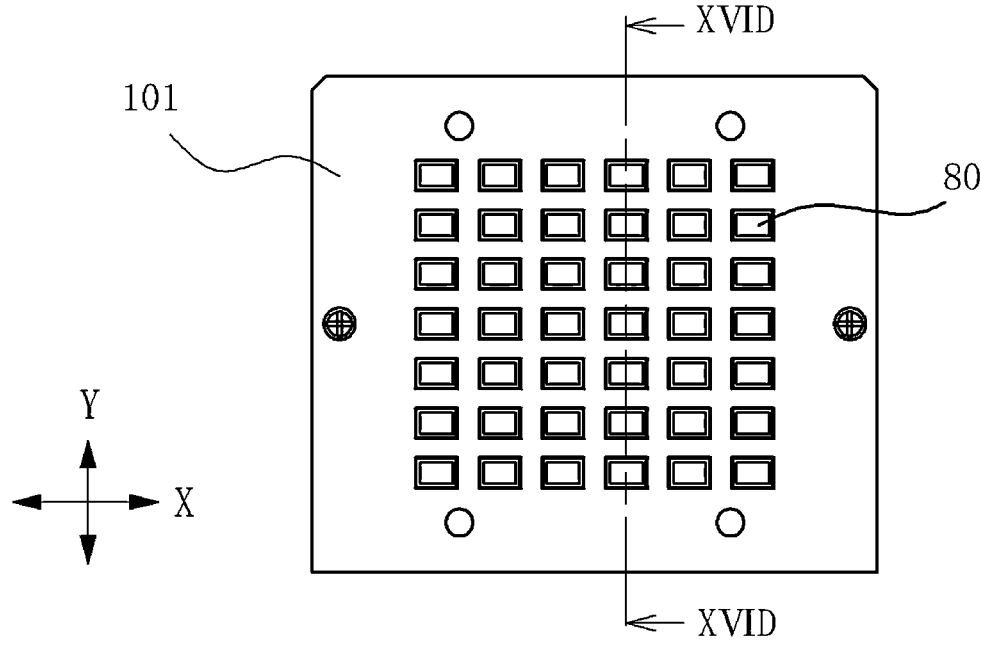
FIG. 16C is a top view for describing the manufacturing method of the sealing member according to the embodiment.
Figure 16D:
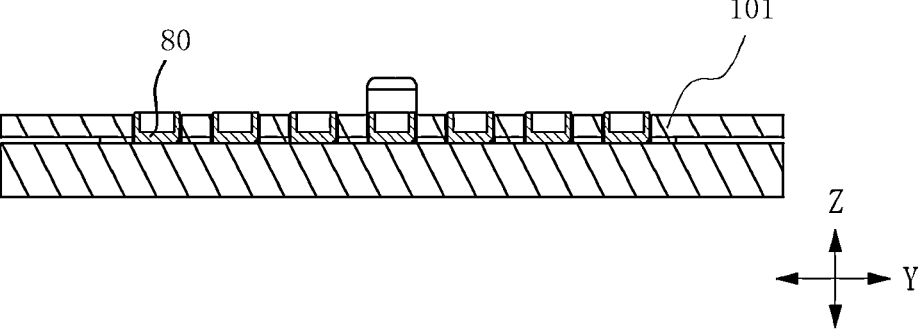
FIG. 16D is a sectional view taken along the line XVID-XVID in FIG. 16C.

In the fifth step, the base material 80 is fitted to each of the plurality of recesses of the fitting base material 101 (see FIGS. 16C and 16D). One base material 80 is fitted to one recess. The base material 80 is fitted with the upper surface 71A of the upper portion 71 facing the flat surface of the recess. The base material 80 is fitted to the recess of the fitting base material 101 with the lower surface 72C of the base material 80 facing upward. Note that in this phase, the metal pattern 74 is not provided on the lower surface 72C of the base material 80. Hereafter, to avoid confusion between the upper and lower directions, the surface corresponding to the upper surface 71A of the upper portion 71 is referred to as a first surface, the surface corresponding to the lower surface 71B of the upper portion 71 is referred to as a second surface, and the surface corresponding to the lower surface 72C of the lateral wall portion 72 is referred to as a third surface.

Figure 16E:
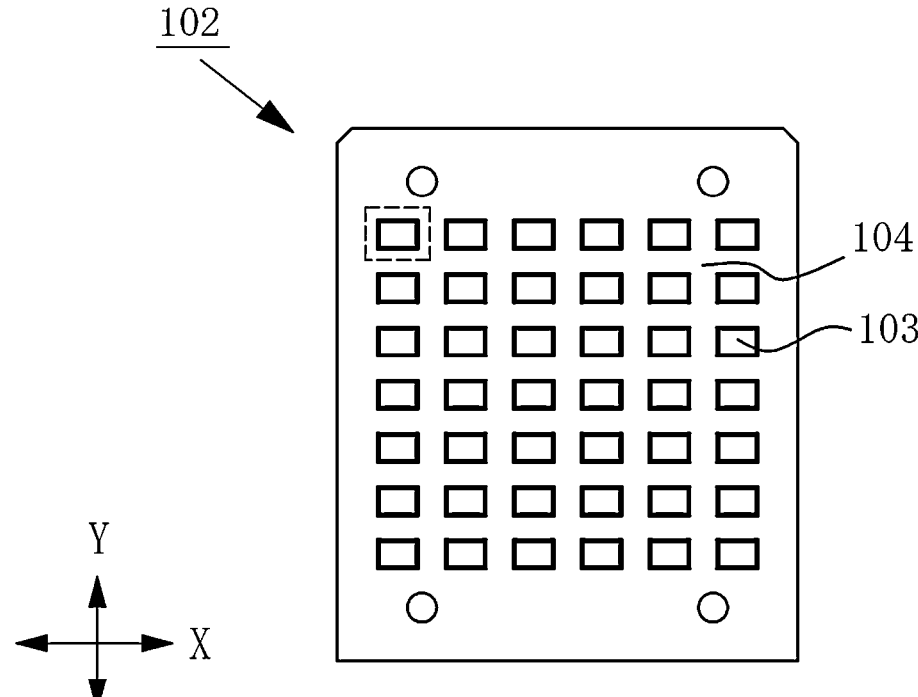
FIG. 16E is a top view for describing the manufacturing method of the sealing member according to the embodiment.
Figure 16F:
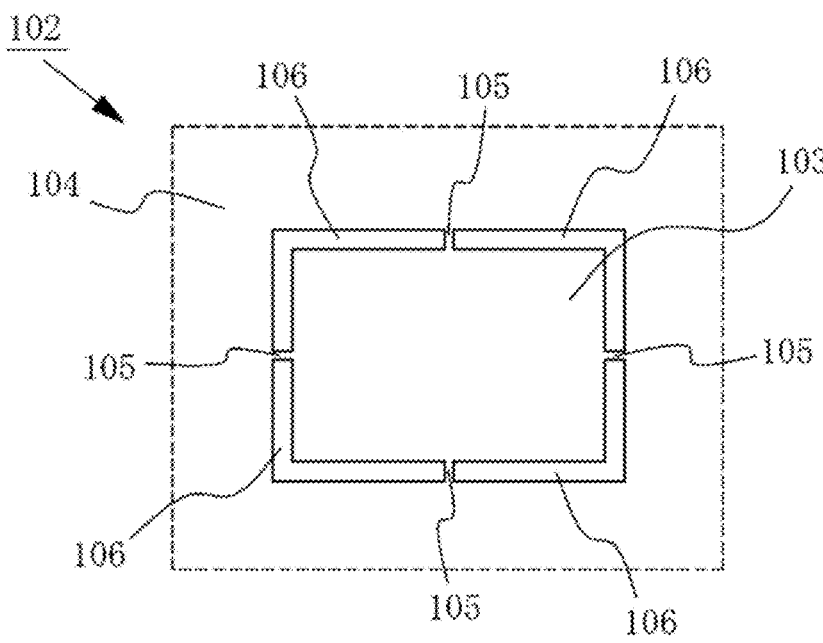
FIG. 16F is an enlarged view of the portion surrounded by the broken line in FIG. 16E.
Figure 16G:
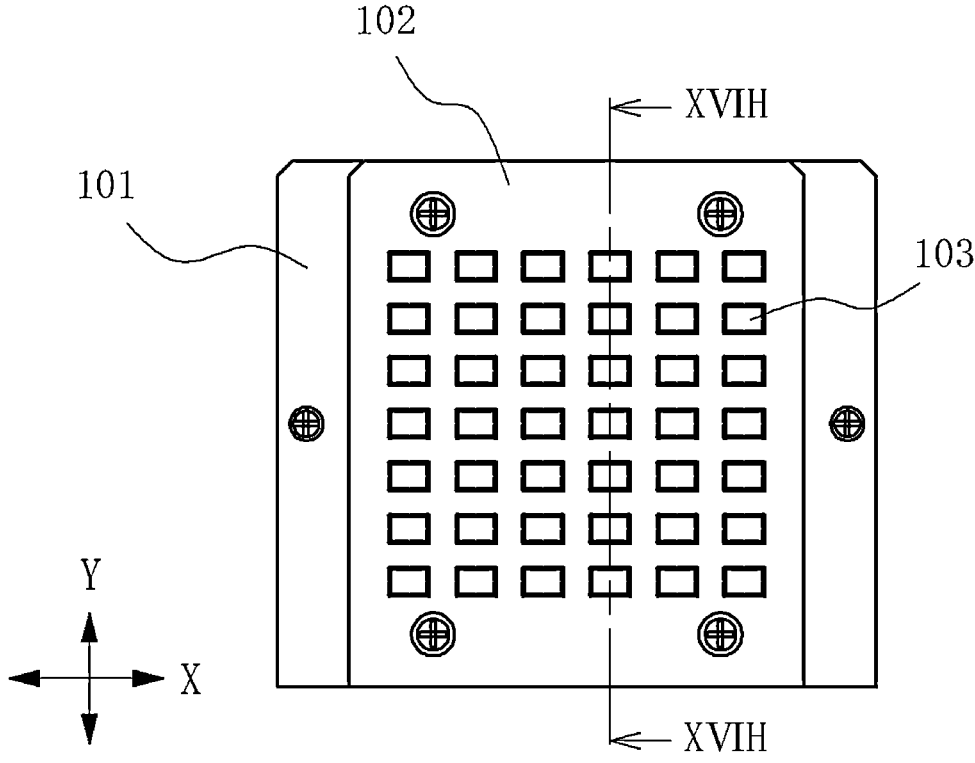
FIG. 16G is a top view illustrating the manufacturing method of the sealing member according to the embodiment.
Figure 16H:
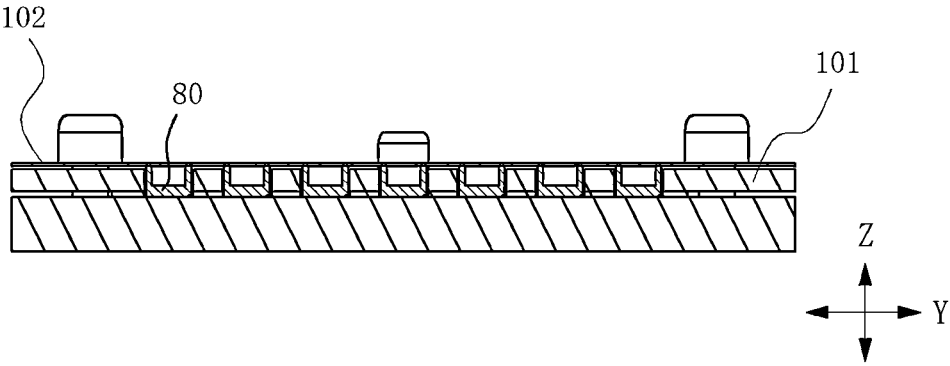
FIG. 16H is a sectional view taken along the line XVIH-XVIH in FIG. 16G.
Figure 16I:
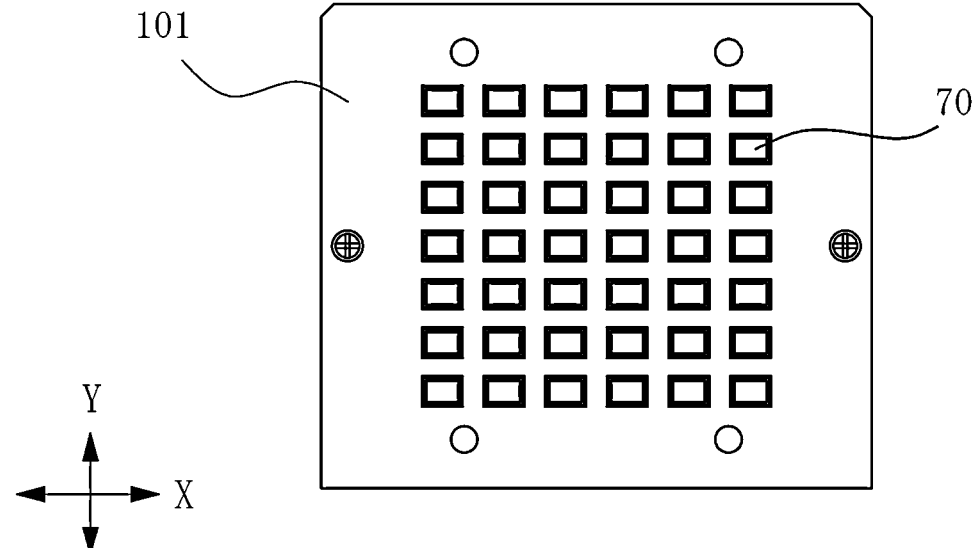
FIG. 16I is a top view illustrating the manufacturing method of the sealing member according to the embodiment.

At the sixth step, the mask member 102 is installed on the plurality of base materials 80 (see FIGS. 16G and 16H). Note that FIGS. 16E and 16F are schematic diagrams illustrating the mask member 102.

The mask member 102 can be formed with a metal material, for example. The mask member 102 includes a plurality of first portions 103, a second portion 104 surrounding the plurality of first portions 103, and a plurality of connecting members 105 that connects the first portion 103 and the second portion 104. Except at the portions connected by the connecting member 105, the first portion 103 and the second portion 104 are spaced apart from each other, and thus a through hole 106 is formed.

The mask member 102 has a shape in which a plurality of virtual through holes ignoring the connecting member 105 is provided in the second portion 104, one first portion 103 is disposed in each through hole, and the linear connecting members 105 for connecting the first portions 103 to the second portion 104 are provided at corresponding positions.

The mask member 102 is installed such that each of the plurality of first portions 103 individually corresponds to the base materials 80 fitted to the plurality of recesses. The mask member 102 is installed such that the through hole 106 is located directly above a third surface 72C of the base material 80.

One first portion 103 may be connected to the second portion 104 with two or more connecting members 105. The two or more connecting members 105 include the connecting member 105 that connects one side (hereinafter referred to as "first side") of the outer edge of the first portion 103 and one side of the second portion 104 opposing the first side, and the connecting member 105 that connects a side (hereinafter referred to as "second side") of the outer edge of the first portion 103 opposite to the first side and one side of the second portion 104 opposing the second side. That is, the two or more connecting members 105 include the connecting members 105 connected to the second portion 104 from the paired sides of the first portion 103.

More preferably, the two or more connecting members 105 include the connecting member 105 that connects one side (hereinafter referred to as "third side") of the outer edge of the first portion 103 different from the first side and the second side and one side of the second portion 104 opposing the third side, and the connecting member 105 that connects a side (hereinafter referred to as "fourth side") of the outer edge of the first portion 103 opposite to the third side and one side of the second portion 104 opposing the fourth side. With the four connecting members 105, the force of holding the first portion 103 against the second portion 104 is large.

The connecting member 105 connected to a side of the first portion 103 has a width, in the direction along the side, in a range from 50 μm to 200 μm. This width need only be a minimum width enough to stably hold the first portion 103. In addition, in the case in which the metal pattern 74 is provided also directly below the connecting member 105 to form the metal pattern 74 with a continuous shape, it is preferable that the width be not excessively large.

The distance from the first portion 103 to the second portion 104 (the width of the through hole 106) is smaller than the width from the inner edge to the outer edge at the third surface 72C of the sealing member 70. This width of the through hole 106 may be within a range from 100 μm to 340 μm. At the portion between the second portion 104 and one first portion 103, excluding the portion where the connecting member 105 is connected to the first portion 103, one or a plurality of through holes 106 are formed surrounding the first portion 103. The one or a plurality of through holes 106 are formed with a constant width from the outer edge of the first portion 103.

The shape of the first portion 103 is larger than the shape (hereinafter referred to as "first shape") defined by the inner edge of the third surface 72C. In a top view, the mask member 102 is installed such that the first portion 103 covers the second surface 71B of the base material 80. In a top view, the mask member 102 is installed such that the first portion 103 covers a portion of the third surface 72C of the base material 80 along the inner edge of the third surface 72C. The first portion 103 covers the third surface 72C within a range of 30 μm to 150 μm from the outer edge of the first shape. Ensuring a width of 30 μm or more from the inner edge of the third surface 72C makes it easier for the mask member 102 to cover the first shape even when some displacement occurs in the manufacturing process.

The shape made when the first portion 103 and the through hole 106 provided surrounding the first portion 103 are combined is smaller than a shape (hereinafter referred to as "second shape") defined by the outer edge of the third surface 72C. In a top view, the mask member 102 is installed such that the second portion 104 covers a portion of the third surface 72C along the outer edge of the third surface 72C of the base material 80. The second portion 104 covers the third surface 72C within a range of 30 μm to 150 μm from the outer edge of the second shape.

The direction in which the connecting member 105 connected to the first side extends from the first portion 103 to the second portion 104 and the direction in which the connecting member 105 connected to the second side extends from the first portion 103 to the second portion 104 are opposite directions parallel to each other.

The direction in which the connecting member 105 connected to the third side extends from the first portion 103 to the second portion 104 and the direction in which the connecting member 105 connected to the fourth side extends from the first portion 103 to the second portion 104 are opposite directions parallel to each other.

The direction in which the connecting member 105 connected to the first side extends from the first portion 103 to the second portion 104 and the direction in which the connecting member 105 connected to the third side extends from the first portion 103 to the second portion 104 are not parallel to each other, and form a predetermined angle other than 0 degree and 180 degrees. The predetermined angle is within a range from 45 degrees to 135 degrees. Alternatively, this predetermined angle is within an angle range of a ±fluctuation width of a half value with respect to a value obtained by dividing 360 degrees by the number of sides of the shape of the first portion 103. For example, in a case in which the first portion 103 has a rectangular shape, the number of sides is four and the ±fluctuation width is 45 degrees, which is the half value of 90 degrees. Accordingly, the angle is within a range from 45 degrees to 135 degrees. In addition, in the mask member 102 illustrated in the drawings, the predetermined angle is 90 degrees.

In the seventh step, the metal pattern 74 is provided on the base material 80 through the through hole 106 formed in the mask member 102. The metal pattern 74 is formed on the surface of the base material 80 by sputtering, for example. In this manner, the sealing member 70 in which the metal pattern 74 is formed is obtained (see FIG. 16I).

The shape of the metal pattern 74 formed in the base material 80 depends on the shape of the through hole 106. By adjusting the width of the connecting member 105 and the film formation conditions when forming the metal pattern 74, the metal pattern 74 can be provided also directly below the connecting member 105, and the metal pattern 74 can be formed with a continuous shape. The portion formed directly below the connecting member 105 of the metal pattern 74 may serve as the thin portion 74A in the sealing member 70. After performing the seventh step, the sealing member 70 illustrated in FIG. 6 is manufactured.

The metal pattern 74 can be collectively formed for the plurality of the base materials 80 by the above-described manufacturing method, which improves the productivity of the sealing member 70. This effect can be achieved in cooperation with or independently from the suppression of stray bonding material and the reliability of the apparatus. In other words, the manufacturing method of the sealing member 70 could also be an invention that does not require the suppression of stray bonding material and the reliability of the apparatus.

Figure 17:
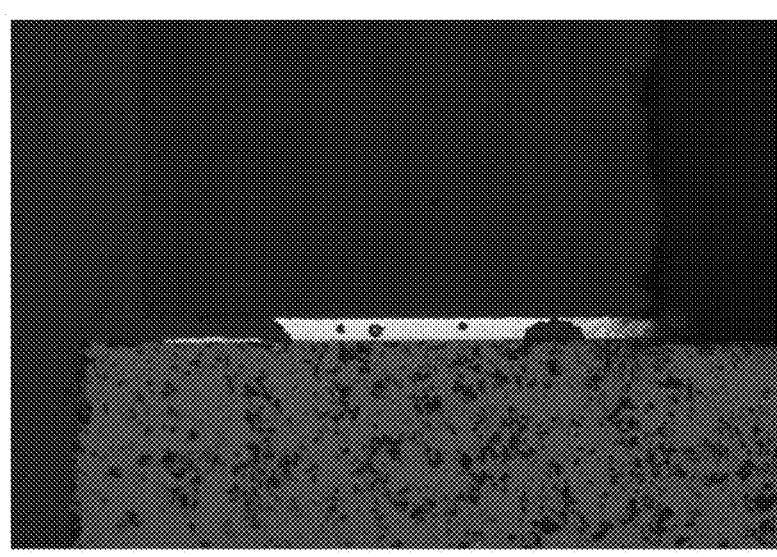
FIG. 17 is an image showing joining at a thin portion in the light-emitting device according to the embodiment.
Figure 18:
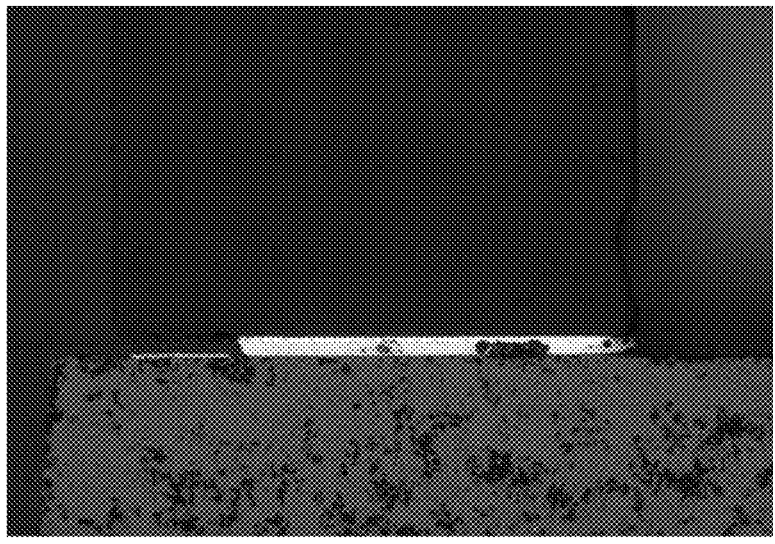
FIG. 18 is an image showing joining at a portion that is not a thin portion in the light-emitting device according to the embodiment.

FIGS. 17 and 18 are images of cross sections showing joining of the mounting substrate 10 and the sealing member 70 in the light-emitting device 1. FIG. 17 is an image of a cross section passing through the thin portion 74A of the sealing member 70, and FIG. 18 is an image of a cross section passing through a portion that is not the thin portion 74A of the sealing member 70. As illustrated in the drawings, in both the thin portion 74A and the portion that was not the thin portion 74A, the joining member 90 was formed between the first metal pattern 16A and the metal pattern 74, and stable joining was achieved.

The joining member 90 is provided between the first metal pattern 16A and the metal pattern 74, between the first metal pattern 16A and the second metal pattern 16B, and between the first metal pattern 16A and the third metal pattern 16C. In addition, the joining member 90 may be provided between the second metal pattern 16B and the metal pattern 74. The joining member 90 may be provided between the third metal pattern 16C and the metal pattern 74.

Although each of the embodiments according to the present invention has been described above, the light-emitting device according to the present invention is not strictly limited to the light-emitting device in each of the embodiments. In other words, the present invention can be achieved without being limited to the external shape or structure of the light-emitting device disclosed by each of the embodiments. The present invention may be applied without requiring all the components being sufficiently provided. For example, in a case in which some of the components of the light-emitting device disclosed by the embodiments are not stated in the scope of the claims, the degree of freedom in design by those skilled in the art such as substitutions, omissions, shape modifications, and material changes for those components is allowed, and then the invention stated in the scope of the claims being applied to those components is specified.

The light-emitting device according to each of the embodiments described above can be used for a head-mounted device, a head-mounted display, a projector, an on-vehicle headlight, lighting, a display, and the like.

What is claimed is:

1. A manufacturing method of a light-emitting device, comprising:
    preparing a mounting substrate having a flat upper surface including a mounting surface, the mounting substrate including a first metal pattern arranged on the upper surface, a second metal pattern arranged on the upper surface inward of the first metal pattern in a plan view, and a third metal pattern arranged on the upper surface outward of the first metal pattern in the plan view;
    arranging a light-emitting element over the mounting surface of the mounting substrate;
    applying a bonding material to the first metal pattern; and
    joining a sealing member to at least the first metal pattern of the mounting substrate via the bonding material, the sealing member including a fourth metal pattern with a width greater than a width of the first metal pattern, an outer side of the fourth metal pattern being arranged inward of an outer side of the third metal pattern in the plan view, and an inner side of the fourth metal pattern being arranged outward of an inner side of the second metal pattern in the plan view.

2. The manufacturing method according to claim 1, wherein
    the preparing of the mounting substrate includes preparing the mounting substrate including the first metal pattern with the width in a range greater than or equal to 100 μm and less than 200 μm, the second metal pattern with a width in a range of greater than 50 μm and less than or equal to 100 μm, and the third metal pattern with a width in a range of greater than 50 μm and less than or equal to 100 μm.

3. The manufacturing method according to claim 2, wherein
    the preparing of the mounting substrate includes preparing the mounting substrate in which a sum of the width of the first metal pattern, the width of the second metal pattern, the width of the third metal pattern, a distance from the first metal pattern to the second metal pattern, and a distance from the first metal pattern to the third metal pattern is less than or equal to 500 μm.

4. The manufacturing method according to claim 1, wherein
    the preparing of the mounting substrate includes preparing the mounting substrate including the second metal pattern and the third metal pattern having the same width.

5. The manufacturing method according to claim 1, wherein
    the preparing of the mounting substrate includes preparing the mounting substrate in which the second metal pattern is spaced apart from the first metal pattern by a distance in a range from 30 μm to 200 μm, and the third metal pattern is spaced apart from the first metal pattern by a distance in a range from 30 μm to 200 μm.

6. The manufacturing method according to claim 1, wherein
    the preparing of the mounting substrate includes preparing the mounting substrate in which a sum of the width of the first metal pattern, a width of the second metal pattern, a width of the third metal pattern, a distance from the first metal pattern to the second metal pattern, and a distance from the first metal pattern to the third metal pattern is less than or equal to 500 μm.

7. The manufacturing method according to claim 1, wherein the joining of the sealing member includes joining the sealing member and the mounting substrate such that the fourth metal pattern overlaps all of the first metal pattern, a portion of the second metal pattern, and a portion of the third metal pattern in the plan view.

8. A light-emitting device comprising:

a mounting substrate having a flat upper surface including a mounting surface, the mounting substrate including a first metal pattern arranged on the upper surface, a second metal pattern arranged on the upper surface inward of the first metal pattern in a plan view, and a third metal pattern arranged on the upper surface outward of the first metal pattern in the plan view;

a light-emitting element arranged over the mounting surface; and a sealing member joined to at least the first metal pattern of the mounting substrate via a joining member, the sealing member including a fourth metal pattern with a width greater than a width of the first metal pattern, an outer side of the fourth metal pattern being arranged inward of an outer side of the third metal patten in the plan view, and an inner side of the fourth metal pattern being arranged outward of an inner side of the second metal pattern in the plan view.

9. The light-emitting device according to claim 8, wherein the mounting substrate includes the first metal pattern with the width in a range greater than or equal to 100 μm and less than 200 μm, the second metal pattern with a width in a range of greater than 50 μm and less than or equal to 100 μm, and the third metal pattern with a width in a range of greater than 50 μm and less than or equal to 100 μm.

10. The light-emitting device according to claim 9, wherein a sum of the width of the first metal pattern, the width of the second metal pattern, the width of the third metal pattern, a distance from the first metal pattern to the second metal pattern, and a distance from the first metal pattern to the third metal pattern is less than or equal to 500 μm.

11. The light-emitting device according to claim 8, wherein a width of the second metal pattern and a width of the third metal pattern are the same.

12. The light-emitting device according to claim 8, wherein the second metal pattern is spaced apart from the first metal pattern by a distance in a range from 30 μm to 200 μm, and the third metal pattern is spaced apart from the first metal pattern by a distance in a range from 30 μm to 200 μm.

13. The light-emitting device according to claim 8, wherein a sum of the width of the first metal pattern, a width of the second metal pattern, a width of the third metal pattern, a distance from the first metal pattern to the second metal pattern, and a distance from the first metal pattern to the third metal pattern is less than or equal to 500 μm.

14. The light-emitting device according to claim 8, wherein the fourth metal pattern overlaps all of the first metal pattern, a portion of the second metal pattern, and a portion of the third metal pattern in the plan view.

15. The light-emitting device according to claim 14, wherein the joining member is a cured bonding material, and the joining member is arranged between the first metal pattern and the fourth metal pattern, between the first metal pattern and the second metal pattern, and between the first metal pattern and the third metal pattern.

16. The light-emitting device according to claim 15, wherein the sealing member includes a joint surface, the fourth metal pattern is provided at the joint surface, the fourth metal pattern having a width smaller than a width of the joint surface, and the joining member does not protrude beyond the joint surface in the plan view.

17. A manufacturing method of a light-emitting device, comprising:

preparing a mounting substrate having a flat upper surface including a mounting surface, the mounting substrate including a first metal pattern arranged on the upper surface, a second metal pattern arranged on the upper surface inward of the first metal pattern in a plan view, and a third metal pattern arranged on the upper surface outward of the first metal pattern in the plan view:

arranging a light-emitting element over the mounting surface of the mounting substrate;

applying a bonding material to the first metal pattern; and joining a sealing member to at least the first metal pattern of the mounting substrate via the bonding material, the sealing member including a fourth metal pattern with a width greater than a width of the first metal pattern, wherein the joining of the sealing member includes preparing the sealing member so that the fourth metal pattern includes a thin portion with a smaller thickness than other portions of the fourth metal pattern.

18. A light-emitting device comprising:

a mounting substrate having a flat upper surface including a mounting surface, the mounting substrate including a first metal pattern arranged on the upper surface, a second metal pattern arranged on the upper surface inward of the first metal pattern in a plan view, and a third metal pattern arranged on the upper surface outward of the first metal pattern in the plan view:

a light-emitting element arranged over the mounting surface; and a sealing member joined to at least the first metal pattern of the mounting substrate via a joining member, the sealing member including a fourth metal pattern with a width greater than a width of the first metal pattern, wherein the fourth metal pattern includes a thin portion with a smaller thickness than other portions of the fourth metal pattern.

* * * * *